(12) United States Patent
Iida et al.

(10) Patent No.: US 10,804,642 B2
(45) Date of Patent: Oct. 13, 2020

(54) SHIELD COVER

(71) Applicants: Sumitomo Wiring Systems, Ltd., Yokkaichi-shi, Mie (JP); Toyota Jidosha Kabushiki Kaisha, Toyota-shi, Aichi (JP)

(72) Inventors: Tetsuya Iida, Yokkaichi (JP); Yosuke Kurono, Okazaki (JP); Tatsuhiko Mizutani, Toyota (JP)

(73) Assignees: Sumitomo Wiring Systems, Ltd. (JP); Toyota Jidosha Kabushiki Kaisha (JP)

( * ) Notice: Subject to any disclaimer, the term of this patent is extended or adjusted under 35 U.S.C. 154(b) by 217 days.

(21) Appl. No.: 15/769,154

(22) PCT Filed: Oct. 12, 2016

(86) PCT No.: PCT/JP2016/080176
§ 371 (c)(1),
(2) Date: Apr. 18, 2018

(87) PCT Pub. No.: WO2017/073315
PCT Pub. Date: May 4, 2017

(65) Prior Publication Data
US 2018/0316122 A1    Nov. 1, 2018

(30) Foreign Application Priority Data

Oct. 28, 2015    (JP) .................................. 2015-211611

(51) Int. Cl.
*H01R 13/52* (2006.01)
*H05K 9/00* (2006.01)
*H05K 7/14* (2006.01)

(52) U.S. Cl.
CPC ....... *H01R 13/5213* (2013.01); *H05K 7/1432* (2013.01); *H05K 9/00* (2013.01)

(58) Field of Classification Search
None
See application file for complete search history.

(56) References Cited

U.S. PATENT DOCUMENTS 9,024,183 B2    5/2015    Sakakura
9,071,023 B2    6/2015    Kondo
(Continued)

FOREIGN PATENT DOCUMENTS

| JP | 2012-236450 | 12/2012 |
| JP | 2012-238422 | 12/2012 |
| JP | 2013-149481 | 8/2013 |

OTHER PUBLICATIONS

ASM Handbook vol. 14B Metalworking: Sheet Forming, ASM International, 2006, pp. 293-306 Forming Processes for Sheet, Strip, and Plate (16 pp.) (Year: 2006).*

(Continued)

*Primary Examiner* — Adam Krupicka
(74) *Attorney, Agent, or Firm* — Gerald E. Hespos; Michael J. Porco; Matthew T. Hespos

(57) ABSTRACT

A shield cover (1) made of metal is configured to be attached to a device and includes a cover body (10) configured to cover a shield target. Two planar attachment plates (11, 13) protrude from the cover body (10). Bolt insertion holes (11A, 13A) extend through the respective attachment plates (11, 13) in a thickness direction thereof and receive bolts (30) for attaching the shield cover (1) to the device. The attachment plates (11, 13) are configured to be attached to the device with brackets (20) sandwiched between the device and the attachment plates (11, 13). A rib (12) extends up along an edge of at least one of the attachment plates (11, 13) to reinforce a portion of the attachment plate (11, 13) that will not be sandwiched between the bolt (30) and the bracket (20).

5 Claims, 5 Drawing Sheets

(56) References Cited

U.S. PATENT DOCUMENTS

| | | |
|---|---|---|
| 9,203,178 B2 | 12/2015 | Sakakura |
| 2012/0285097 A1 | 11/2012 | Sakakura |
| 2012/0285718 A1 | 11/2012 | Sakakura |
| 2013/0189879 A1 | 7/2013 | Kondo |

OTHER PUBLICATIONS

International Search Report and Written Opinion dated Dec. 27, 2016.
International Preliminary Report on Patentability.
Japanese Office Action dated Jan. 9, 2018.

* cited by examiner

SHIELD COVER

BACKGROUND

Field of the Invention

The technology disclosed herein relates to a shield cover.

Description of the Related Art

A metal shield cover configured to be attached to a device to cover a shield target has been known (for example, see Japanese Unexamined Patent Application Publication No. 2012-238422). Specifically, a seal cover (corresponding to the shield cover) described in Japanese Unexamined Patent Application Publication No. 2012-238422 is configured to cover a connector (corresponding to the shield target) and includes a metal cover main body and mounting plates. The cover main body has an elongated elliptical and inverted shallow saucer like overall shape. The mounting plates project from edges of the opening in a length direction on the underside of the cover main body and each have an insertion hole for a bolt.

A shield cover may be attached to a device with brackets being disposed between the mounting plates and the device. In such case, a lower surface of the shield cover is in contact with the brackets at two positions and the other portions are not in contact with anything.

When the seal cover (the shield cover) described in Japanese Unexamined Patent Application Publication No. 2012-238422 is viewed in a direction perpendicular to the surface of the mounting plate, the center of gravity is displaced to one side of an imaginary straight line extending through the centers of the two insertion holes. Thus, if brackets are disposed between the mounting plates and the device to attach the shield cover, the center of gravity of the shield cover would be shifted relative to the mounting plates when the device vibrates, making the stress to concentrate on a portion of the mounting plate not sandwiched between the bolt and the bracket. This increases the need for improving the strength of the portion of the mounting plate not sandwiched between the bolt and the bracket.

This specification discloses a technology for improving the strength of the portion of the mounting plate of the shield cover not sandwiched between the bolt and the bracket to improve the strength of the shield cover relative to vibrations.

SUMMARY

A shield cover disclosed herein is a shield cover made of metal and configured to be attached to a device to cover a shield target. The shield cover includes a cover body, two attachment plates, and a rib. The cover body is configured to cover the shield target. The attachment plates protrude from the cover body to be in a planar shape. The attachment plates have bolt insertion holes extending through the attachment plates in a thickness direction and into which bolts for attaching the shield cover to the device are inserted, respectively. The attachment plates are configured to be attached to the device with brackets each being sandwiched between the device and the attachment plates. The rib extends upward from at least one of the attachment plates along an edge thereof and reinforcing a portion of the attachment plate not sandwiched between the bolt and the bracket.

If stress concentrates on the portion of the attachment plate not sandwiched between the bolt and the bracket, a twisting force would be applied to the attachment plate, generating a crack on the portion.

The above-described shield cover includes the rib, which reinforces the portion of the attachment plate not sandwiched between the bolt and the bracket. Thus, the attachment plate is less likely to twist, and a crack is less likely to be generated at the portion not sandwiched between the bolt and the bracket. In other words, in the attachment plate of the shield cover, the rib improves the strength of the portion not sandwiched between the bolt and the bracket. This improves the strength of the shield cover against vibrations.

The rib may be located, when viewed from a direction perpendicular to a surface of the attachment plate, on the edge on a side where a center of gravity of the shield cover is located in relation to an imaginary straight line extending through centers of the two bolt insertion holes.

The above-described crack extends, when viewed from a direction perpendicular to the surface of the attachment plate, from the edge on the side where the center of gravity of the shield cover is located in relation to the imaginary straight line extending through the centers of the two bolt insertion holes toward the inner side of the attachment plate.

In the above-described shield cover, the rib is on the edge on the side where the center of gravity of the shield cover is located in relation to the above-described imaginary straight line, a crack is less likely to be generated compared with a case where the rib is located on an edge on a side where the center of gravity is not located. This further improves the strength of the portion of the attachment plate not sandwiched between the bolt and the bracket.

In addition, a portion of the attachment plate on the side where the center of gravity is located in relation to the imaginary straight line may have a substantially triangular shape having a hypotenuse gradually tilted toward the cover body with an increasing distance from the imaginary straight line. The rib may be formed by bending a portion protruding from the edge of the attachment plate constituting the hypotenuse along the edge.

For example, the attachment plate may have a substantially rectangular shape, and the rib may extend along two sides of the rectangle with the corner therebetween. In such a case, the rib needs to be bent at 90 degrees along the edges, and the process of forming such a rib is complex. Alternatively, the attachment plate may have a substantially semi-circular shape and the rib may extend along the edge. In such a case, the rib needs to be curved in a circular arc shape along the edge, and the process of forming such a rib is complex.

Compared to such configurations, in the above-described shield cover, the rib is readily formed, since the rib is able to be formed by only bending the portion protruding from the edge constituting the hypotenuse along the hypotenuse, i.e., a straight line.

The cover body may have a substantially cuboidal shape and may include a top wall substantially parallel to a cover attachment surface of the device, a first side wall extending continuously from the top wall, and two second side walls facing each other with the first side wall therebetween. The two attachment plates may protrude substantially in parallel to the top wall from an edge of the respective second side walls adjacent to the cover attachment surface. Only one of the two attachment plates may be provided with the rib, and the other of the two attachment plates not provided with the rib may be provided with a reinforcing wall extending, when viewed in a direction perpendicular to a surface of the attachment plate, from an edge on a side where the center of gravity of the shield cover is not located in relation to the imaginary straight line extending through the centers of the two bolt insertion holes, and the reinforcing wall may extend continuously from the second side wall.

In the above-described shield cover, the reinforcing wall extends upward from the attachment plate not provided with the rib, and the reinforcing wall is integral with the second side wall of the cover body. Thus, the other attachment plate not provided with the rib is also less likely to twist. This improves the strength of the portion of the other attachment plate not sandwiched between the bolt and the bracket.

A protruded portion may protrude in a planar shape in substantially parallel to the top wall from an edge of the reinforcing wall opposite the attachment plate. The protruded portion may be integral with the top wall.

In the above-described shield cover, the protruded portion protrudes in a planar shape from the edge of the reinforcing wall opposite the attachment plate and the protruded portion is integral with the top wall. Thus, the other attachment plate is less likely to twist. This improves the strength of the portion not sandwiched between the bolt and the bracket.

In the shield cover disclosed herein, the portion of the attachment plate not sandwiched between the bolt and the bracket is improved, and the strength of the shield cover against vibrations is improved.

DETAILED DESCRIPTION

An embodiment is described with reference to FIG. 1 to FIG. 5. In the following description, an up-down direction is based on the up-down direction in FIG. 1, and a front-rear direction and a left-right direction are based on the front-rear direction and the left-right direction in FIG. 3.

Figure 1:
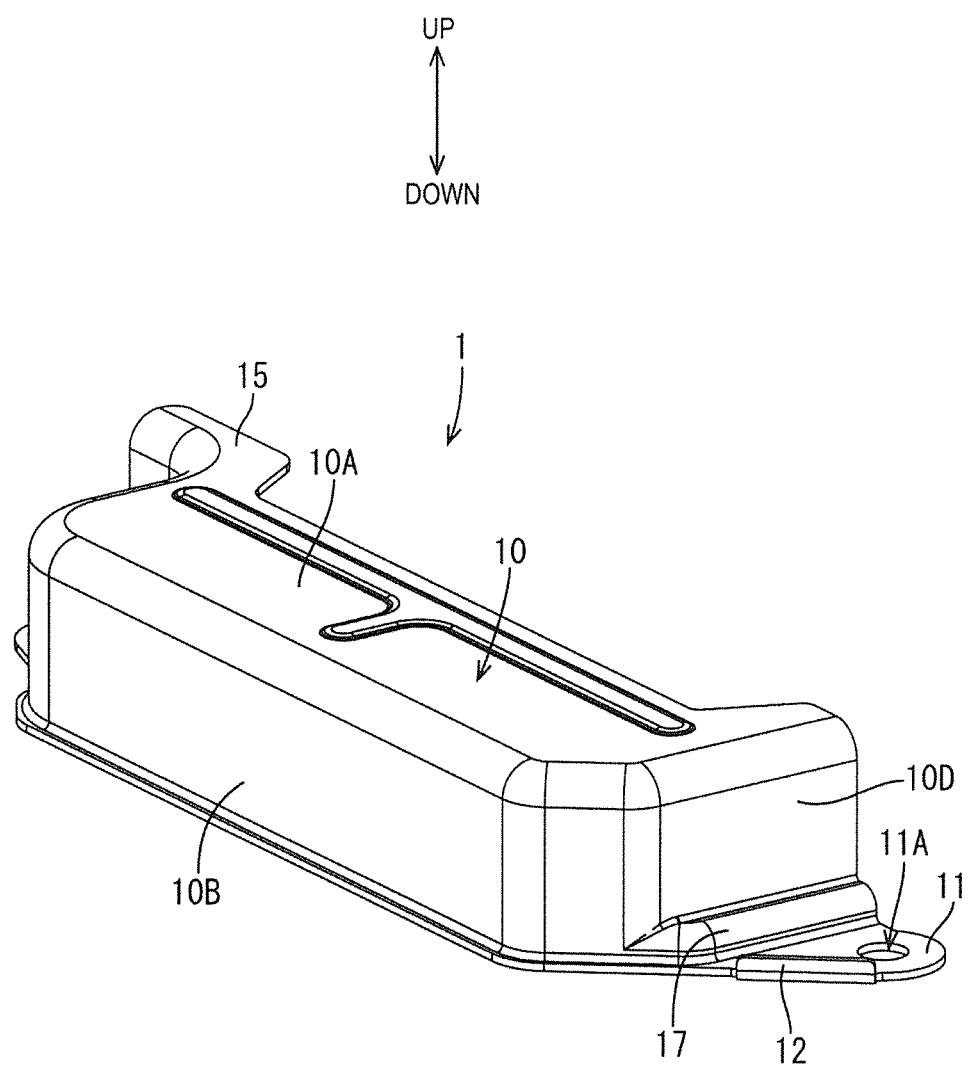
FIG. 1 is a perspective view of a shield cover according to an embodiment.

First, with reference to FIG. 1, a shield cover 1 according to the embodiment is briefly described. The shield cover 1 is configured to be attached to a metal terminal block 2 (see FIG. 4) attached to an inverter in a vehicle, such as an electric car and a hybrid car.

Specifically, in the terminal block 2, a bus bar connected to an inverter and a terminal fitting connected to an electric wire are fastened together with a bolt. The shield cover 1 is configured to be attached to a cover attachment surface 2A (see FIG. 4) of the terminal block 2 to cover the bus bar and the terminal fitting. The terminal block 2 is an example of the device. The bus bar and the terminal fitting are examples of the shield target.

(1) Configuration of Shield Cover

Figure 2:
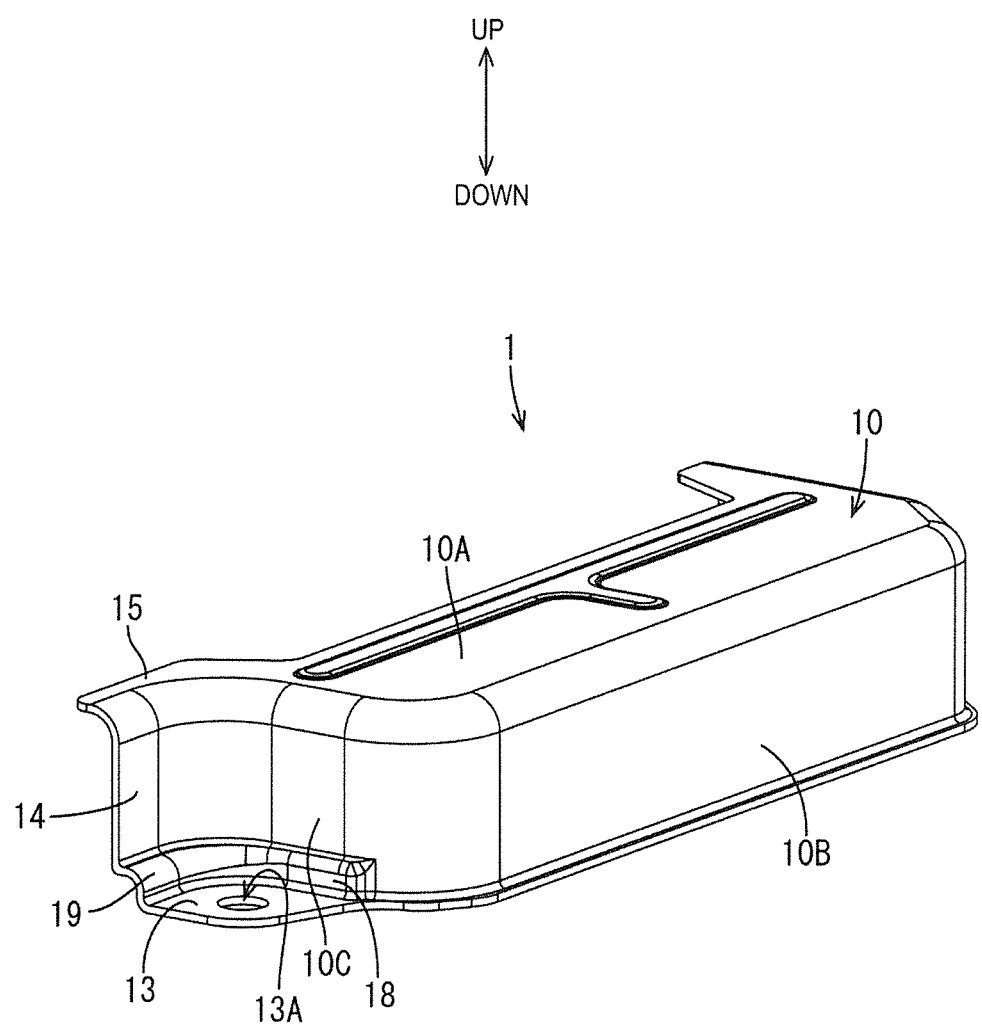
FIG. 2 is a perspective view of the shield cover.

The shield cover 1 is formed by pressing a metal plate and includes a cover body 10, a right attachment plate 11, a rib 12 (illustrated in FIG. 1), a left attachment plate 13, a reinforcing wall 14, and a protruded portion 15 (illustrated in FIG. 2). The left and right attachment plates 13 and 11 are examples of two attachment plates.

As illustrated in FIG. 1 and FIG. 2, the cover body 10 has a substantially cuboidal overall shape and includes an oblong top wall 10A substantially parallel to the cover attachment surface 2A of the terminal block 2, a front wall 10B (one example of a first side wall), a left side wall 10C, and a right side wall 10D, which extend continuously from the top wall 10A. The left and right side walls 10C and 10D are examples of the two side walls.

The left and right side attachment plates 13 and 11 are configured to attach the shield cover 1 to the terminal block 2 and respectively protrude in a planar shape in substantially parallel to the top wall 10A from the lower side (adjacent to the cover attachment surface 2A) of the left and right side walls 10C and 10D. The attachment plates 11 and 13 respectively have bolt insertion holes 11A and 13A extending through the attachment plates 11 and 13 in the thickness direction. A bolt 30 (see FIG. 4) for attaching the shield cover 1 to the terminal block 2 is inserted into each of the bolt insertion holes 11A and 13A.

Figure 3:
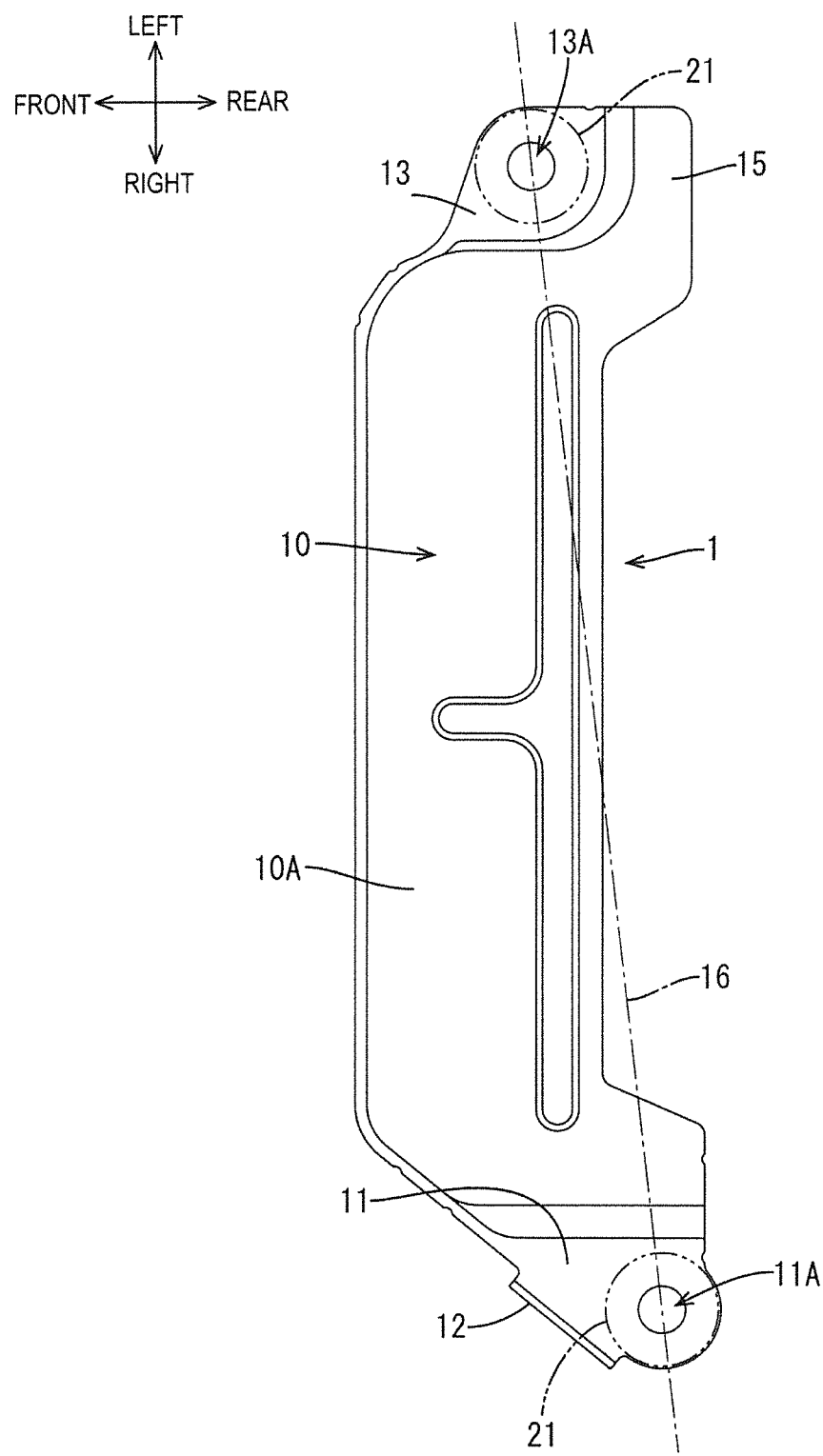
FIG. 3 is a top view of the shield cover.

As illustrated in FIG. 3, when the shield cover 1 according to the embodiment is viewed from the top (in a direction perpendicular to the surface of the attachment plates 11 and 13), the center of gravity thereof is located on the front side of an imaginary straight line 16 extending through the centers of the bolt insertion holes 11A and 13A. The portion of the right attachment plate 11 on the front side of the imaginary straight line 16, when viewed from the top, i.e., the portion on the side where the center of gravity of the shield cover 1 is located, has a substantially triangular shape having a hypotenuse gradually tilted toward the cover body 10 with the increasing distance from the imaginary straight line 16.

As illustrated in FIG. 1, a curved portion 17 is located between the right side wall 10D and the right attachment plate 11 to improve the strength of the shield cover 1. The curved portion 17 looks as if it is formed by pushing a joint between the right side wall 10D and the right attachment plate 11 diagonally from the lower side to the top right.

As illustrated in FIG. 3, the left attachment plate 13 has a substantially rectangular shape. As illustrated in FIG. 2, a curved portion 18 is also located between the left side wall 10C and the left attachment plate 13.

As illustrated in FIG. 1, the rib 12 extends upward along the edge of the right attachment plate 11. Specifically, the rib 12 is formed by bending up the oblong portion, which protrudes from the edge constituting the hypotenuse of the right attachment plate 11, at about 90 degrees along the edge. As illustrated in FIG. 3, the hypotenuse is located on the front side of the imaginary straight line 16 (the side where the center of gravity of the shield cover 1 is located), and thus the rib 12 is located on the edge of the right attachment plate 11 on the side where the center of gravity of the shield cover 1 is located in relation to the imaginary straight line 16.

As illustrated in FIG. 2, the reinforcing wall 14 extends in the upward direction along the rear edge of the left attachment plate 13 (the edge on the side where the center of gravity is not located in relation to the imaginary straight line 16) and extends in a curved form continuously from the left side wall 10C. A curved portion 19 extending continuously from the curved portion 18 is also located between the left attachment plate 13 and the reinforcing wall 14.

As illustrated in FIG. 3, the protruded portion 15 protrudes rearward in substantially parallel to the top wall 10A from the upper edge of the reinforcing wall 14 (the edge opposite the left attachment plate 13). The protruded portion 15 is integral with the top wall 10A.

(2) Attachment of Shield Cover

Next, with reference to FIG. 4, attachment of the shield cover 1 to the terminal block 2 will be explained.

Figure 4:
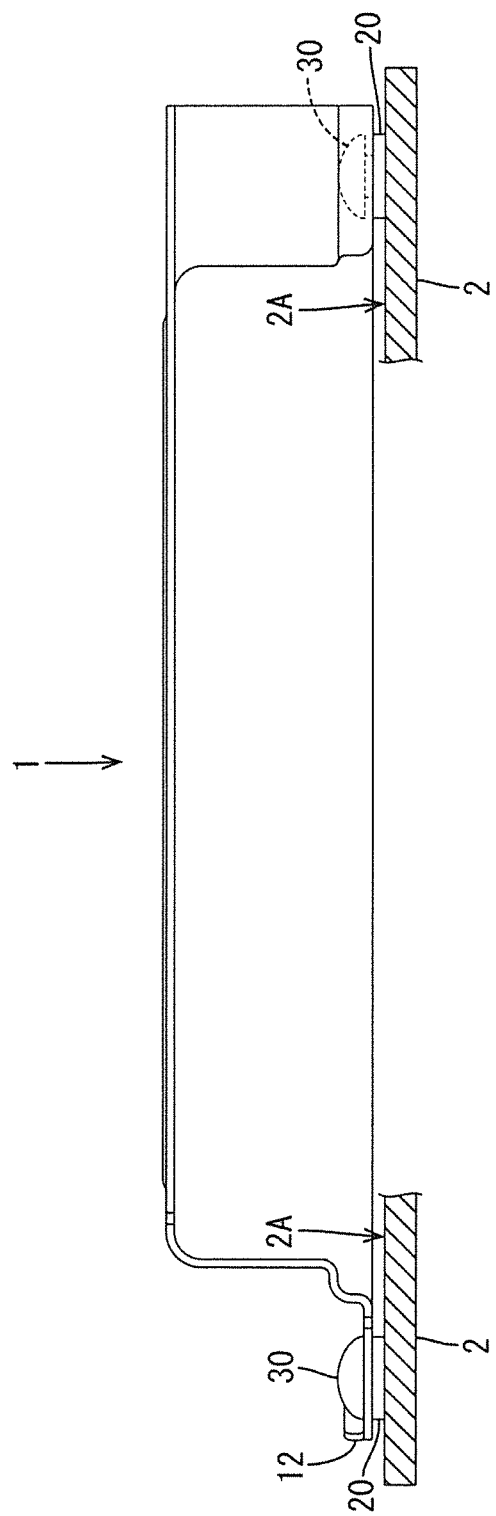
FIG. 4 is a rear view of the shield cover.

As illustrated in FIG. 4, the shield cover 1 is fixed to the terminal block 2 with ring-shaped metal brackets 20 therebetween. Thus, the lower surface of the shield cover 1 is not in contact with anything except for the two positions in contact with the brackets 20. In FIG. 3, circles 21 each indicated by a two-dot chain line indicate portions of the attachment plates 11 and 13 sandwiched between the bolts 30 and the brackets 20.

(3) Vibration Testing on Shield Cover

Figure 5:
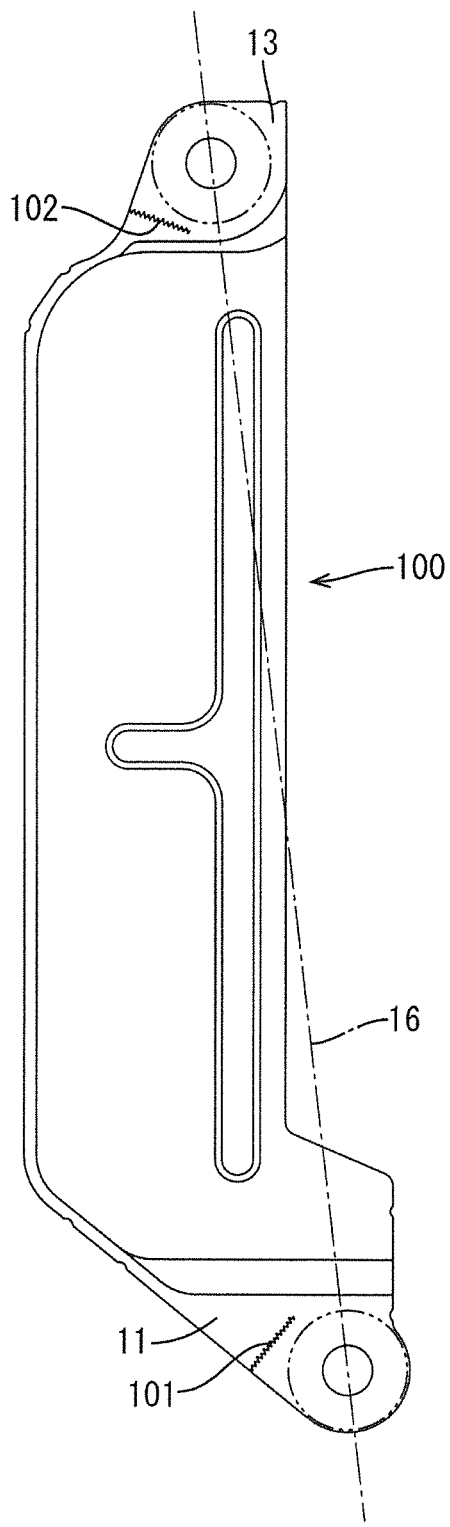
FIG. 5 is a top view of a shield cover according to a comparative example.

First, with reference to FIG. 5, the result of the vibration testing on a shield cover 100 (referred to as the "shield cover 100 according to a comparative example" hereinafter) is explained. The shield cover 100 includes the same components as the shield cover 1 according to the embodiment except for the rib 12, the reinforcing wall 14, and the protruded portion 15.

The inventor of the present application performed vibration testing by using a vibration testing machine attached to the shield cover 100 according to the comparative example. In some cases, cracks 101 and 102 illustrated in FIG. 5 were generated in the attachment plates 11 and 13. The cracks 101 and 102 extend, when viewed from the top, from the edges of the attachment plates 11 and 13 on the front side (the side where the center of gravity of the shield cover 100 is located) of the imaginary straight line 16 toward the inner side of the attachment plates 11 and 13.

The cracks 101 and 102 were generated because the center of gravity of the shield cover 100 was shifted in the up-down direction in relation to the attachment plates 11 and 13. This was caused by that the center of gravity of the shield cover 100 was displaced to the front side of the imaginary straight line 16 and the lower surface of the shield cover 100 was not in contact with anything except for the two positions in contact with the brackets 20.

Specifically, when the center of gravity of the shield cover 100 is shifted in the up-down direction, the stress concentrates on the portions of the attachment plates 11 and 13 not sandwiched between the bolts 30 and the brackets 20, applying a twisting force to the attachment plates 11 and 13. This generates the cracks 101 and 102 extending from the edges on the side where the center of gravity of the shield cover 100 is located toward the inner side of the attachment plates 11 and 13.

In contrast, the inventor of the present application performed the vibration testing on the shield cover 1 according to the embodiment under the same condition, and no crack was generated. No crack was generated on the edge of the right attachment plate 11, because the right attachment plate 11 has the rib 12 on the edge on the front side of the imaginary straight line 16 as described above. The rib 12 reinforced the portion of the right attachment plate 11 not sandwiched between the bolt 30 and the bracket 20, and the right attachment plate 11 was less likely to twist.

No crack was generated on the left attachment plate 13, because, although the shield cover 100 according to the comparative example only includes the left side wall 100 extending from the edge of the substantially rectangular left attachment plate 13, the shield cover 1 includes the reinforcing wall 14, which extends upward from the rear edge in addition to the left side wall 100, and the reinforcing wall 14 is integral with the left side wall 100. The left attachment plate 13 was further less likely to twist compared with that in the shield cover 100 according to the comparative example. Furthermore, the shield cover 1 includes the protruded portion 15 extending rearward in a planar shape from the upper edge of the reinforcing wall 14, and the protruded portion 15 is integral with the top wall 10A. Thus, the left attachment plate 13 is further less likely to twist.

(4) Effects of Embodiment

In the above-described shield cover 1, the right attachment plate 11 is provided with the rib 12 reinforcing the portion not sandwiched between the bolt 30 and the bracket 20. Thus, the right attachment plate 11 is less likely to twist, and a crack is less likely to be generated at the portion not sandwiched between the bolt 30 and the bracket 20. In other words, in the right attachment plate 11 of the shield cover 1, the strength of the portion not sandwiched between the bolt 30 and the bracket 20 is improved. This improves the strength of the shield cover 1 against vibrations.

The right attachment plate 11 may be reinforced by a reinforcing wall 14 and a protruded portion 15, as the left attachment plate 13. However, the reinforcing wall 14 and the protruded portion 15, which are larger than the rib 12, increase the size of the shield cover 12. The rib 12 is able to reinforce the shield cover 12 without increasing the size of the shield cover 12. Furthermore, the terminal block 2 may provide restrictions on the positioning of the reinforcing wall 14 and the protruded portion 15. Since the rib 12 is shorter than the reinforcing wall 14 and does not protrude rearward as the protruded portion 15 does, the rib 12 is able to be provided regardless of the restrictions.

Furthermore, in the shield cover 1, since the rib 12 extends from the edge of the right attachment plate 11 on the side where the center of gravity of the shield cover 1 is located, a crack is less likely to be generated compared with a case in which the rib 12 extends from the edge on the side where the center of gravity is not located. This further improves the strength of the portion of the right attachment plate 11 not sandwiched between the bolt 30 and the bracket 20.

Furthermore, in the shield cover 1, the right attachment plate 11 has a substantially triangular shape, and the rib 12 is formed by bending the portion protruding from the edge constituting the hypotenuse of the right attachment plate 11 along the edge.

For example, the right attachment plate 11 may have a substantially rectangular shape and the rib 12 may extend along two sides with the corner therebetween. In such a case, the rib 12 needs to be bent at 90 degrees along the edges, and the process of forming such a rib 12 is complex. Alternatively, the right attachment plate 11 may have a substantially semi-circular shape and the rib 12 may extend along the edge. In such a case, the rib 12 needs to be curved in a circular arc shape along the edge, and such a process of forming the rib 12 is complex.

In contrast, in the shield cover 1, the rib 12 is readily formed by only bending the portion protruding from the edge constituting the hypotenuse along the straight line.

Furthermore, in the shield cover 1, the reinforcing wall 14 extends upward from the left attachment plate 13, which does not include the rib 12. The reinforcing wall 14 is integral with the left side wall 100 of the cover body 10, and thus the left attachment plate 13 is less likely to twist. This improves the strength of the portion of the left attachment plate 13 not sandwiched between the bolt 30 and the bracket 20.

Furthermore, in the shield cover 1, the protruded portion 15 protrudes in a planar shape from the upper edge of the reinforcing wall 14 (the edge opposite the attachment plate). The protruded portion 15 is integral with the top wall 10A, and thus the left attachment plate 13 is less likely to twist. This further improves the strength of the portion not sandwiched between the bolt 30 and the bracket 20.

Other Embodiments

The technology disclosed herein is not limited to the embodiment described above and illustrated by the drawings. For example, the following embodiments will be included in the technical scope of the present invention.

(1) In the example described in the embodiment, the rib 12 is located on the edge on the side where the center of gravity of the shield cover 1 is located in relation to the imaginary straight line 16, but the position of the rib is not limited to this. For example, the rib may be located on the edge on the side where the center of gravity of the shield cover 1 is not located in relation to the imaginary straight line 16. Such a configuration has higher strength against a twisting force applied to the attachment plates 11 and 13 than the configuration not having the rib. Thus, a crack is less likely to be generated.

(2) In the example described in the embodiment, the attachment plate (the right attachment plate 11) provided with the rib 12 has a substantially triangular shape, but the shape of the attachment plate provided with the rib 12 is not limited to the substantially triangular shape and may be a substantially rectangular shape or a substantially semi-circular shape.

(3) In the example described in the embodiment, only the right attachment plate 11 is provided with the rib 12, but the left attachment plate 13 may also be provided with the rib 12, or only the left attachment plate 13 may be provided with the rib 12.

(4) In the example described in the embodiment, the left attachment plate 13 is provided with both the reinforcing wall 14 and the protruded portion 15, but only the reinforcing wall 14 may be provided and the protruded portion 15 may be eliminated. Furthermore, in the embodiment, only the left attachment plate 13 is provided with the reinforcing wall 14 and the protruded portion 15, but the right attachment plate 11 may also be provided with the reinforcing wall 14 and the protruded portion 15.

(5) In the example described in the embodiment, the cover body 10 includes the top wall 10A, the front wall 10B (a first side wall), the left side wall 10C, and the right side wall 10D, but the cover body 10 may further include a rear wall facing the front wall 10B and may have a box-like shape.

(6) In the embodiment, the terminal block 2 is described as an example of a device to which the shield cover is attached, but the device is not limited to the terminal block 2. For example, the device may be a device to which a connector is attached. The shield cover may be attached to the device to cover the connector (a shield target).

EXPLANATION OF SYMBOLS

1 . . . shield cover, 2 . . . terminal block (one example of a device), 2A . . . cover attachment surface, 10 . . . cover body, 10A . . . top wall, 10B . . . front wall (one example of a first side wall), 10C . . . left side wall (one example of a second side wall), 10D . . . right side wall (one example of a second side wall), 11 . . . right attachment plate (one example of an attachment plate), 11A . . . bolt insertion hole, 12 . . . rib, 13 . . . left attachment plate (one example of an attachment plate), 13A . . . bolt insertion hole, 14 . . . reinforcing wall, 15 . . . protruded portion, 16 . . . imaginary straight line, 20 . . . bracket, 30 . . . bolt

The invention claimed is:

1. A shield cover formed of metal and configured to be attached to a device to cover a shield target, the shield cover comprising:

a cover body configured to cover the shield target;

two attachment plates each protruding in a planar shape from the cover body and each having a bolt insertion hole extending therethrough in a thickness direction and into which a bolt for attaching the shield cover to the device is inserted, the attachment plates being configured to be attached to the device with a bracket therebetween; and a rib extending upward from at least one of the attachment plates along an edge thereof and reinforcing a portion of the attachment plate not sandwiched between the bolt and the bracket, wherein:

the rib is located, when viewed from a direction perpendicular to a surface of the attachment plate, on the edge on a side where a center of gravity of the shield cover is located in relation to an imaginary straight line extending through centers of the two bolt insertion holes, a portion of the attachment plate on the side where the center of gravity is located in relation to the imaginary straight line has a substantially triangular shape having a hypotenuse gradually tilted toward the cover body with an increasing distance from the imaginary straight line, the rib is obtained by bending a portion protruding from the edge of the attachment plate constituting the hypotenuse along the edge, the cover body has a substantially cuboidal shape and includes a top wall substantially parallel to a cover attachment surface of the device, a first side wall extending continuously from the top wall, and two second side walls facing each other with the first side wall therebetween, the two attachment plates protrude substantially in parallel to the top wall from an edge of the respective second side walls adjacent to the cover attachment surface, only one of the two attachment plates is provided with the rib, and the other of the two attachment plates not provided with the rib is provided with a reinforcing wall extending, when viewed in a direction perpendicular to a surface of the attachment plate, from an edge on a side where the center of gravity of the shield cover is not located in relation to the imaginary straight line extending through the centers of the two bolt insertion holes, and the reinforcing wall extends continuously from the second side wall.

2. The shield cover according to claim 1, further comprising a protruded portion protruding in a planar shape in substantially parallel to the top wall from an edge of the reinforcing wall opposite the attachment plate, the protruded portion being integral with the top wall.

3. A shield cover formed of metal and configured to be attached to a device to cover a shield target, the shield cover comprising:

a cover body configured to cover the shield target;

two attachment plates each protruding in a planar shape from the cover body and each having a bolt insertion hole extending therethrough in a thickness direction and into which a bolt for attaching the shield cover to the device is inserted, the attachment plates being configured to be attached to the device with a bracket therebetween; and a rib extending upward from at least one of the attachment plates along an edge thereof and reinforcing a portion of the attachment plate not sandwiched between the bolt and the bracket, wherein the rib is located, when viewed from a direction perpendicular to a surface of the attachment plate, on the edge on a side where a center of gravity of the shield cover is located in relation to an imaginary straight line extending through centers of the two bolt insertion holes, the cover body has a substantially cuboidal shape and includes a top wall substantially parallel to a cover attachment surface of the device, a first side wall extending continuously from the top wall, and two second side walls facing each other with the first side wall therebetween, the two attachment plates protrude substantially in parallel to the top wall from an edge of the respective second side walls adjacent to the cover attachment surface, only one of the two attachment plates is provided with the rib, and the other of the two attachment plates not provided with the rib is provided with a reinforcing wall extending, when viewed in a direction perpendicular to a surface of the attachment plate, from an edge on a side where the center of gravity of the shield cover is not located in relation to the imaginary straight line extending through the centers of the two bolt insertion holes, and the reinforcing wall extends continuously from the second side wall.

4. The shield cover according to claim 3, further comprising a protruded portion protruding in a planar shape in substantially parallel to the top wall from an edge of the reinforcing wall opposite the attachment plate, the protruded portion being integral with the top wall.

5. The shield cover according to claim 3, wherein a portion of the attachment plate on the side where the center of gravity is located in relation to the imaginary straight line has a substantially triangular shape having a hypotenuse gradually tilted toward the cover body with an increasing distance from the imaginary straight line, and the rib is obtained by bending a portion protruding from the edge of the attachment plate constituting the hypotenuse along the edge.

* * * * *